(12) United States Patent
Yoshida

(10) Patent No.: US 7,656,163 B2
(45) Date of Patent: Feb. 2, 2010

(54) REMAINING-CAPACITY DISPERSION DETECTING APPARATUS AND REMAINING-CAPACITY CONTROL APPARATUS FOR BATTERY PACK

(75) Inventor: Shinsuke Yoshida, Kanagawa (JP)

(73) Assignee: Nissan Motor Co., Ltd., Yokohama-shi (JP)

(*) Notice: Subject to any disclaimer, the term of this patent is extended or adjusted under 35 U.S.C. 154(b) by 224 days.

(21) Appl. No.: 11/822,417

(22) Filed: Jul. 5, 2007

(65) Prior Publication Data

US 2008/0048617 A1  Feb. 28, 2008

(30) Foreign Application Priority Data

Jul. 6, 2006  (JP) ............................. 2006-186233

(51) Int. Cl.
*G01N 27/416* (2006.01)

(52) U.S. Cl. ...................... 324/429; 320/116; 320/118; 320/132; 324/434

(58) Field of Classification Search .................. 320/116, 320/118–119, 122, 132; 324/429, 433–434; 702/64

See application file for complete search history.

(56) References Cited

U.S. PATENT DOCUMENTS 6,417,648 B2 * 7/2002 Suzuki et al. ............... 320/136
6,661,231 B1 * 12/2003 Arai et al. ................... 324/426
7,332,891 B2 * 2/2008 Sugimoto ................... 320/116

FOREIGN PATENT DOCUMENTS

JP    2004-297852 A    10/2004

* cited by examiner

*Primary Examiner*—Edward Tso
*Assistant Examiner*—Ramy Ramadan
(74) *Attorney, Agent, or Firm*—Foley & Lardner LLP

(57) ABSTRACT

A remaining-capacity dispersion detecting apparatus for a battery pack having a plurality of cells includes a total voltage sensing section adapted to sense a total voltage which is a terminal voltage of the whole of battery pack; a storing section adapted to store a value of the total voltage when the battery pack becomes under unloaded condition from loaded condition; and a dispersion detecting section. The dispersion detecting section is adapted to detect a value of the total voltage at a time of activation before the battery pack becomes under the loaded condition from the unloaded condition, to compare the currently-detected total voltage value with the total voltage value previously stored by the storing section, and to detect a dispersion in respective remaining capacities of the plurality of cells in the case where a difference between the currently-detected total voltage value and the previously-stored total voltage value is greater than or equal to a predetermined value.

9 Claims, 4 Drawing Sheets

REMAINING-CAPACITY DISPERSION DETECTING APPARATUS AND REMAINING-CAPACITY CONTROL APPARATUS FOR BATTERY PACK

BACKGROUND OF THE INVENTION

The present invention relates to a remaining-capacity dispersion detecting apparatus for detecting a dispersion state in remaining capacities of respective cells constituting a battery pack and a remaining-capacity control apparatus for controlling the remaining capacities of cells.

In an electric vehicle that runs by using a motor (battery) or a hybrid vehicle that runs by using two of motor and internal combustion engine, a battery pack (assembled battery) including a plurality of cells (capacitors or single batteries) connected in series with or in series-parallel with each other is used as a power-source for driving the motor provided to drive the vehicle. Note that the above-mentioned battery pack in explanations according to the present invention also implies a plurality of capacitors connected in series with or in series-parallel with each other. In such battery pack, a dispersion in remaining capacities (i.e., charging rate or state of charge) of respective cells is caused based on differences in self-discharge, deterioration, and internal resistance of each cell when leaving the battery pack for a long time, e.g., for a few months. When the dispersion in remaining capacities of respective cells has occurred, usable electric power of battery pack is restricted. Hence, it is necessary to suppress the dispersion in the remaining capacities as far as possible. Accordingly, a processing for adjusting the dispersion in remaining capacities (equalizing the remaining capacities, i.e., charging rates) is carried out by detecting the dispersion in remaining capacities.

In the case where the above-mentioned dispersion of remaining capacities is detected, if the dispersion of remaining capacities is detected when the battery pack is under a loaded condition where the battery pack is supplying electric power to a load, voltage and current vary according to a variation of the load. Thereby, it is difficult to accurately detect the dispersion in remaining capacities of respective cells. Therefore, a published Japanese Patent Application No. 2004-297852 discloses a previously-proposed processing for detecting the dispersion in remaining capacities on the basis of a voltage (i.e., open voltage) at the time of activation (at the time of no-load).

SUMMARY OF THE INVENTION

However, in the case where the degree of several hundred cells are included in the battery pack such as a battery pack for electric vehicle, it takes some time (for example, several seconds) to detect or read in voltages (data) of all cells. Hence, If the dispersion detection of remaining capacity is carried out whenever the vehicle is activated; a time period until the vehicle becomes capable of starting moving is elongated, and therefore there is a possibility that a driver is frustrated. In the above-described Japanese Patent Application discloses a method of estimating an elapsed time from when the vehicle was previously stopped (i.e., when it was finished to use the vehicle) till when the vehicle is currently activated (turned on), on the basis of a coolant temperature of engine and an ambient temperature. As another method, it is also conceivable that this elapsed time is measured by a timer receiving electric power from a low-voltage battery (12V-battery) which is provided to supply electric power to a control system for the battery pack or to supply electric power to kinds of auxiliary equipments such as a headlamp, a wiper, and a starter motor. In this case, the dispersion detection is conceivably omitted if the elapsed time is relatively short.

However in the case where the battery pack is left or unused for a long period (several months); the coolant temperature cannot be used and hence it is impossible to reliably judge the long-period nonuse of battery pack. Accordingly, there has been a problem that the driver has a sense of dissatisfaction due to the execution of dispersion detection processing in the case where the dispersion detection processing does not need to be executed at the time of activation of vehicle, or a problem that the dispersion detection processing is not executed when the dispersion detection processing needs to be executed. Moreover, in the case where the elapsed time is measured by using the power source for driving the kinds of auxiliary equipments as mentioned above, the power source (low-voltage battery) for driving the kinds of auxiliary equipments continues to supply (consume) electric power to the timer so that there is a fear that the low-voltage battery becomes over-discharged.

It is therefore an object of the present invention to provide a dispersion detecting apparatus and/or method devised to properly carry out the processing for detecting the dispersion in capacities of respective cells of a battery pack.

According to one aspect of the present invention, there is provided a remaining-capacity dispersion detecting apparatus for a battery pack, the battery pack including a plurality of cells capable of being charged and discharged, the remaining-capacity dispersion detecting apparatus comprising: a total voltage sensing section adapted to sense a total voltage which is a terminal voltage of the whole of battery pack; a storing section adapted to store a value of the total voltage when the battery pack becomes under unloaded condition from loaded condition; and a dispersion detecting section adapted to detect a value of the total voltage at a time of activation before the battery pack becomes under the loaded condition from the unloaded condition, to compare the currently-detected total voltage value with the total voltage value previously stored by the storing section, and to detect a dispersion in respective remaining capacities of the plurality of cells in the case where a difference between the currently-detected total voltage value and the previously-stored total voltage value is greater than or equal to a first predetermined value.

According to another aspect of the present invention, there is provided a remaining-capacity control apparatus for a battery pack, the battery pack including a plurality of cells capable of being charged and discharged, the remaining-capacity control apparatus comprising: a total voltage sensing section adapted to sense a total voltage which is a terminal voltage of the whole of battery pack; a storing section adapted to store a value of the total voltage when the battery pack becomes under unloaded condition from loaded condition; a dispersion detecting section adapted to detect a value of the total voltage at a time of activation before the battery pack becomes under the loaded condition from the unloaded condition, to compare the currently-detected total voltage value with the total voltage value previously stored by the storing section, and to detect a dispersion in respective remaining capacities of the plurality of cells in the case where a difference between the currently-detected total voltage value and the previously-stored total voltage value is greater than or equal to a first predetermined value; and a remaining-capacity adjusting section adapted to adjust the respective remaining capacities of the plurality of cells so as to equalize the respective remaining capacities on the basis of the dispersion.

According to still another aspect of the present invention, there is provided a remaining-capacity dispersion detecting apparatus for a battery pack, the battery pack including a plurality of cells capable of being charged and discharged, the remaining-capacity dispersion detecting apparatus comprising: first means for sensing a total voltage which is a terminal voltage of the whole of battery pack; second means for storing a value of the total voltage when the battery pack becomes under unloaded condition from loaded condition; third means for receiving a value of the total voltage from the first means at a time of vehicle activation before the battery pack becomes under the loaded condition from the unloaded condition, and comparing the currently-received total voltage value with the previously-stored total voltage value; and fourth means for sensing respective remaining capacities of the plurality of cells in the case where a difference between the currently-received total voltage value and the previously-stored total voltage value is greater than or equal to a predetermined value, the third means detecting a dispersion in the respective remaining capacities in the case where the difference is greater than or equal to the predetermined value.

According to still another aspect of the present invention, there is provided a remaining-capacity dispersion detecting method for a battery pack, the battery pack including a plurality of cells capable of being charged and discharged, the remaining-capacity dispersion detecting method comprising: sensing and storing a total voltage which is a terminal voltage of the whole of battery pack when the battery pack becomes under unloaded condition from loaded condition; sensing the total voltage at a time of vehicle activation before the battery pack becomes under the loaded condition from the unloaded condition; comparing the total voltage value sensed at the time of activation, with the total voltage value stored when the battery pack became under the unloaded condition; and sensing respective remaining capacities of the plurality of cells and detecting a dispersion in the sensed respective remaining capacities, in the case where a difference between the total voltage value sensed at the time of activation and the total voltage value stored when the battery pack became under unloaded condition is greater than or equal to a predetermined value.

The other objects and features of this invention will become understood from the following description with reference to the accompanying drawings.

DETAILED DESCRIPTION OF THE INVENTION

Reference will hereinafter be made to the drawings in order to facilitate a better understanding of the present invention.

Figure 1:
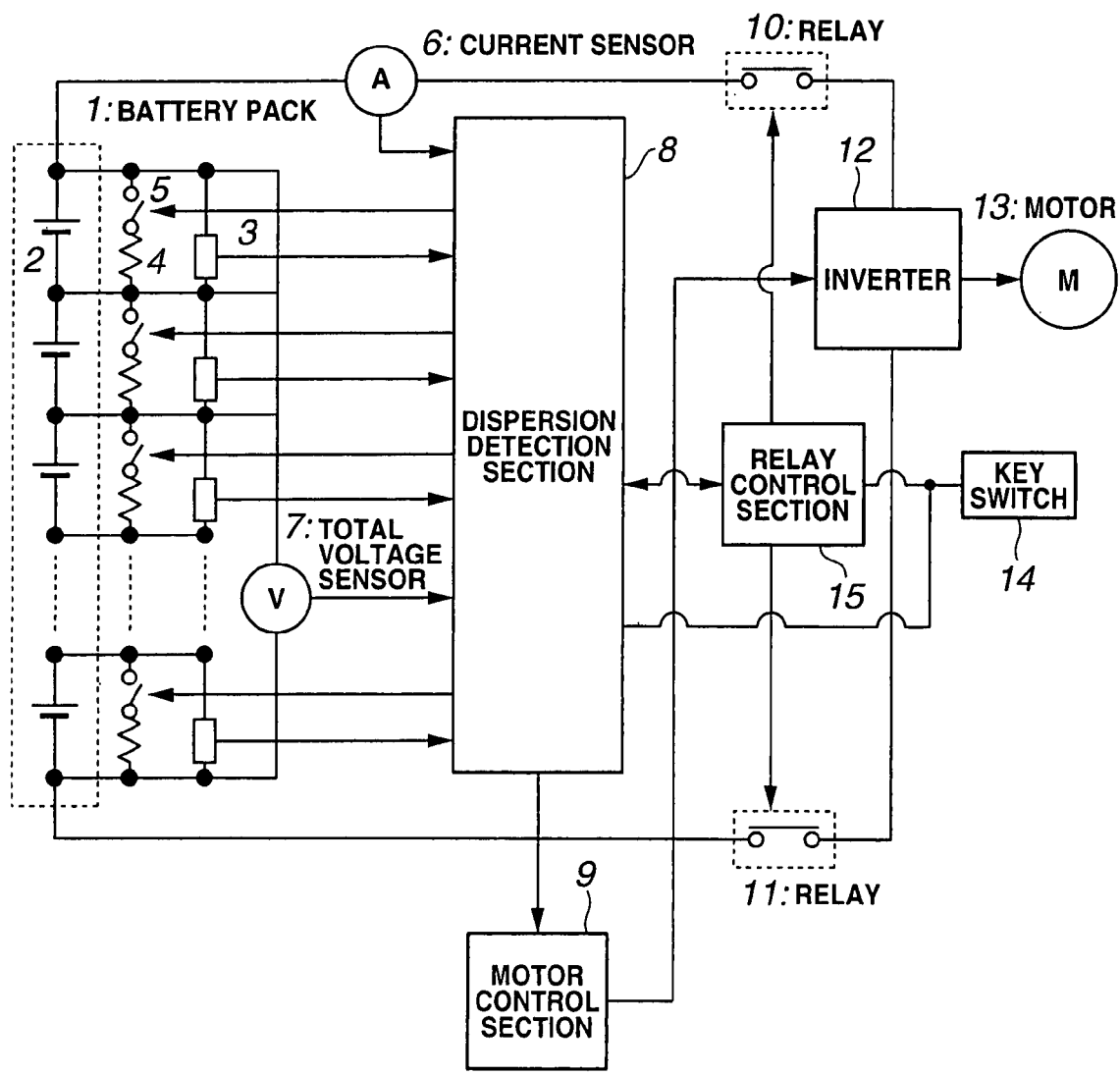
FIG. 1 is a schematic circuit block diagram showing an embodiment according to the present invention.

FIG. 1 is a schematic circuit diagram showing a first embodiment according to the present invention. The first embodiment exemplifies the case where the present invention is applied to a device for driving or controlling a motor for electric vehicle and the like. As shown in FIG. 1, a battery pack (assembled battery) 1 includes a plurality of cells (secondary battery units or capacitors) 2 connected in series with or in series-parallel with one another. For example, a battery pack for electric vehicle has several hundred cells 2. Further as shown in FIG. 1, there are provided voltage sensors 3 each of which serves to sense a terminal voltage of cell 2, resistors 4 for discharge, and semiconductor switches 5. Resistor 4 and semiconductor switch 5 form a discharge circuit for dispersion (variation) adjustment (and correspond to a remaining-capacity adjusting section). Note that the above-mentioned dispersion according to the present invention means a dispersion of a remaining capacity, and will be hereinafter simply called the dispersion. Moreover, the remaining capacity means a remaining electrical energy of each cell 2 or a remaining electrical energy relative to full charge capacity (charging rate, namely, state of charge (SOC)), and will be hereinafter simply called the capacity.

Further as shown in FIG. 1, there are provided a current sensor 6 for measuring an input/output electric current (charging/discharging electric current) of battery pack 1, a total voltage sensor 7 for measuring a total voltage of battery pack 1 i.e., terminal voltage of the whole of battery pack 1, and a dispersion detecting section 8 whose details will be explained below. Further, there are provided a motor control section 9, relays 10 and 11, an inverter 12, and an electric motor 13. Battery pack 1 is under on-load condition (during discharge or during charge) when current sensor 6 senses the charging/discharging current, and is under no-load condition when current sensor 6 senses no charging/discharging current. A key switch 14 (so-called ignition switch) of vehicle is made to ON/OFF by means of a driver operation. This ON/OFF status of key switch 14 is detected by dispersion detecting section 8 and an after-mentioned relay control section 15.

Motor control section 9 includes, for example, a computer having CPU and memory, electronic circuits, and the like. Motor control section 9 generates a drive signal (e.g., PWM signal) for controlling inverter 12 on the basis of external signal such as a signal of accelerator pedal (not shown), a vehicle speed signal, and the like. Inverter 12 converts (DC) electric power of battery pack 1 to AC electric power and thereby drives electric motor 13, by opening/closing (i.e., switching) a switching element(s) included in a circuit of inverter 12 in accordance with the above-mentioned drive signal. On the other hand, inverter 12 charges battery pack 1 by using electric power generated by electric motor 13 during a power-generation action (regenerative action). Relay control section 15 drives relays 10 and 11 to switch relays 10 and 11 between ON and OFF, in accordance with the ON/OFF status of key switch 14 and a command derived from dispersion detecting section 8 (whose details will be mentioned below). Then, relay control section 15 transmits the ON/OFF status of each of relays 10 and 11 to dispersion detecting section 8. Concretely, relay control section 15 turns off relays 10 and 11 when key switch 14 is in OFF status, and turns on relays 10 and 11 on the basis of a relay-ON signal derived from dispersion detecting section 8. Relays 10 and 11 serve to communicate/cut between battery pack 1 and inverter 12 defining the load, and are controlled by relay control section 15 as mentioned above. In the case where relays 10 and 11 are OFF, it can be determined that battery pack 1 is in no-load condition. When key switch 14 is made from OFF to ON, respective parts (including kinds of auxiliary machines and control systems or devices) of the vehicle are activated.

Now, dispersion detecting section 8 according to this embodiment will be explained. Dispersion detecting section 8 includes, for example, a computer having CPU, memory, and the like. Dispersion detecting section 8 reads a voltage value sensed by voltage sensor 3 provided for each cell 2. At this time, the detection voltage of voltage sensor 3 is inputted to dispersion detecting section 8 through an input port of dispersion detecting section 8, and is converted into a digital value by an A/D (analog-to-digital) converter provided inside dispersion detecting section 8, to be read in. Hence, dispersion detecting section 8 cannot read many voltage values at one time due to restrictions in the number of A/D converters and the number of input ports. Accordingly, the detection voltage values of a plurality of voltage sensors 3 are read sequentially by a predetermined amount, for example, by one value (i.e., only the predetermined number of voltage values are read concurrently at one time). Therefore, it takes the order of several seconds to read all the voltage values in the case where the number of cells is several hundreds. Then, dispersion detecting section 8 compares respective cell voltages measured as mentioned above, with one another; and thereby detects or finds cells each of which has a voltage value deviating from the average value of all voltages by a degree greater than or equal to a predetermined amount, as dispersed cells. Note that it is known that the terminal voltage of cell at the time of no-load (i.e., open voltage) correlates with the cell capacity (charging rate: SOC). Therefore, the dispersion of capacity can be detected by comparing the respective cell voltages.

The (detected) dispersed cells having deviations greater than or equal to the predetermined value are adjusted by carrying out a dispersion adjustment. The dispersion adjustment is carried out by turning semiconductor switch 5 forming the discharge circuit for dispersion adjustment, to ON by means of the signal outputted by dispersion detecting section 8; and by discharging each dispersed cell 2 through resistor 4. Here, the dispersion adjustment includes the case where cells having great capacities (i.e., cells whose terminal voltages are relatively high) are discharged and thereby leveled or equalized toward the average value; and the case where cells having small capacities (i.e., cells whose terminal voltages are relatively low) are charged and thereby leveled or equalized toward the average value. In this embodiment, the case where cells having great capacities are discharged is explained as one example.

Figure 2:
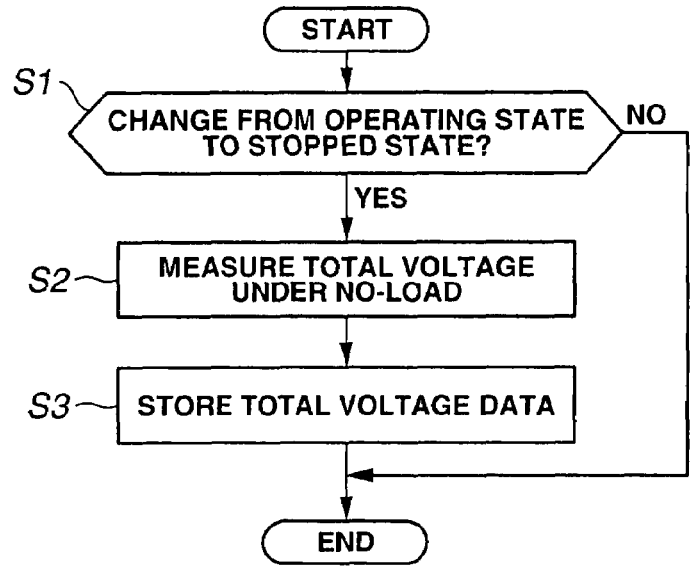
FIG. 2 is a flowchart showing process contents which are executed in a dispersion detecting section 8 in the case where a vehicle becomes in stopped state from in operating state.

Now, process contents which are executed in dispersion detecting section 8 will be explained referring to flowcharts. FIG. 2 is a flowchart showing process contents in the case where the vehicle becomes in its stopped (deactivated) state from in its operating state (i.e., the case where key switch 14 is manipulated from ON to OFF). As shown in FIG. 2, the controller (dispersion detecting section 8) judges (detects) whether or not the vehicle has changed from the operating state to the stopped state, at step S1. The result of this judgment is YES if it is detected that key switch 14 has turned from ON to OFF, or if it is detected that relays 10 and 11 have turned from ON to OFF on the basis of status signal of relays 10 and 11 derived from relay control section 15. In other words, the controller judges whether or not battery pack 1 has become under unloaded condition from loaded condition.

At step S2, the controller reads the total voltage (total sum of terminal voltages of all the cells) which is the terminal voltage of entire battery pack 1 (in this case, which means open voltage since relays 10 and 11 are OFF) sensed by total voltage sensor 7. When total voltage sensor 7 (corresponding to a total voltage sensing section) is faulty, a value corresponding to the total voltage which is detected by, for example, a voltage sensor equipped in inverter 12 or motor 13 may be used as the total voltage. Thus by sensing the total voltage without using total voltage sensor 7, the fault condition of total voltage sensor 7 can be overcome.

At step S3, the controller stores the measured total voltage in a storage device. By using a nonvolatile memory such as EEPROM as this storage device, the total voltage data can be held up (maintained) even if a 12V-battery serving to supply electric power to control systems (which is provided separately from battery pack 1 serving for electric power systems) has become under over discharge, or even if the 12V-battery is replaced with new one.

Figure 3:
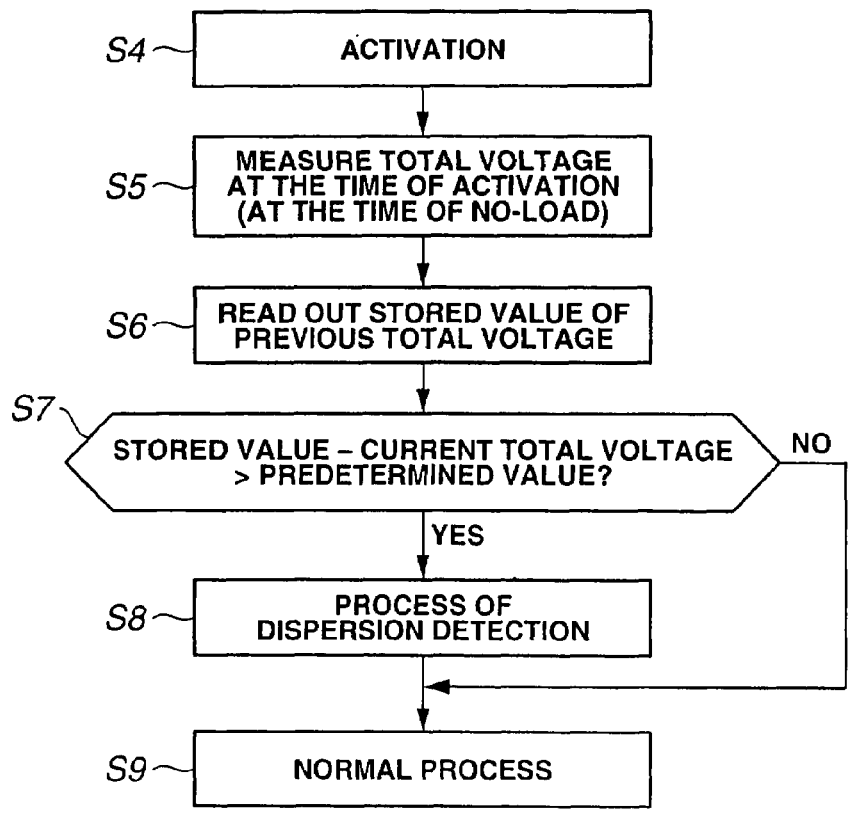
FIG. 3 is a flowchart showing one example of process contents which are executed in dispersion detecting section 8 when dispersion detecting section 8 is activated.

FIG. 3 is a flowchart showing process contents when the vehicle or dispersion detecting section 8 is activated (becomes the operating state). At first at step S4, the vehicle is activated by turning on key switch 14. Although the judgment on this activation timing of vehicle is conducted by using the status of key switch 14, an opening/closing signal of a door switch of vehicle may be used. In this case where the door switch is used; the processing of FIG. 3 is carried out when the door is changed from closed state to open state, and thereby the process of dispersion detection starts earlier. Hence in this case, a waiting time from the time point when the driver gets into the vehicle can be shortened. However in this case, it is necessary to provide a starting equipment for starting or activating the control system when the door is opened from the closed state.

At step S5, the controller measures or detects the current total voltage when activating the vehicle (at the time of no-load). At step S6, the controller reads out the previous (last-time) total voltage value which was stored at step S3. At step S7, the controller compares the read-out previous total voltage with the measured current (this-time) total voltage, and judges whether or not the difference between the previous total voltage and the current total voltage is greater than or equal to a first predetermined value. Since it is expected that the total voltage decreases due to self-discharge and the like in accordance with an elapsed time between the time point when the previous total voltage was stored and the time point when the current total voltage is measured; the following relation (1) is employed for the judgment of step S7.

$$\text{Stored value} - \text{Current total voltage} > \text{First predetermined value} \quad (1)$$

However, an absolute value of the difference may be used as the following relation (2).

$$|\text{Current total voltage} - \text{Stored value}| > \text{First predetermined value} \quad (2)$$

Figure 5:
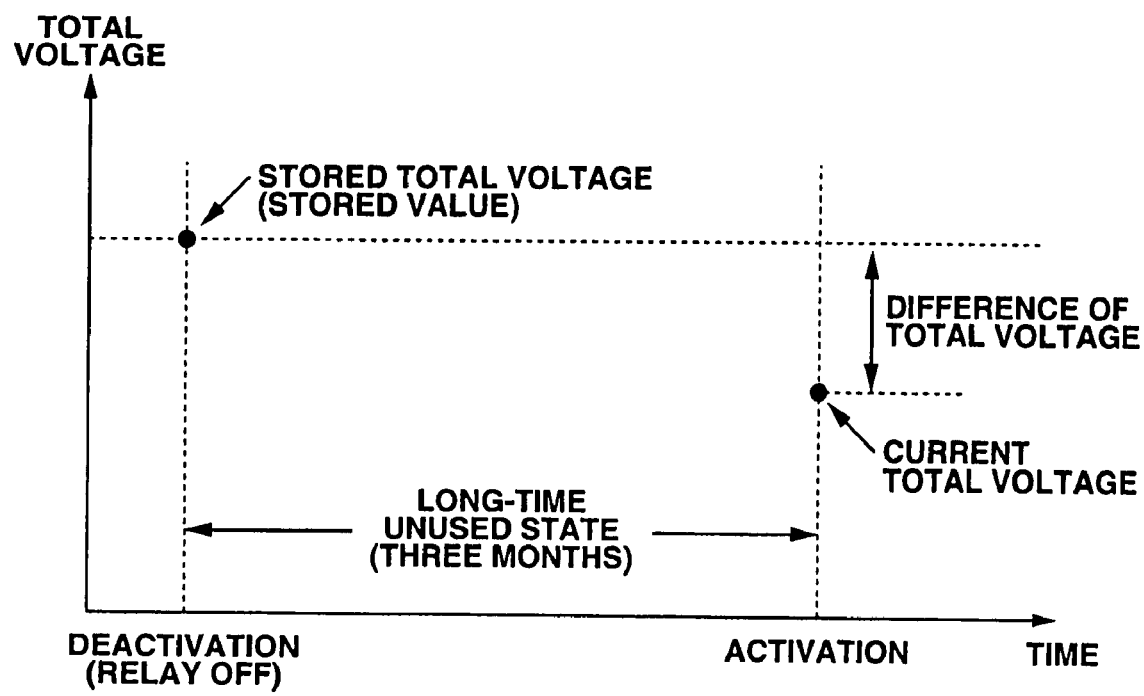
FIG. 5 is a view showing a change of total voltage caused due to a long-time non-usage.

This first predetermined value is a voltage value corresponding to the degree of elapsed time causing the dispersion due to self-discharge, and is a value prescribed through experiments and the like. FIG. 5 is a graph showing a reduced condition of total voltage caused by leaving battery pack 1 for a long time (inactivated period), e.g., for three months. The total voltage difference of FIG. 5 is "Stored value—Current total voltage" shown in the above-mentioned relation (1).

If the answer of step S7 is YES; the (time) variation of total voltage is greater than the predetermined value, and thereby the controller determines that the condition of battery pack 1 has significantly varied. Hence, the controller carries out the process of dispersion detection at step S8. The process of dispersion detection in this case is carried out under the no-load condition where relays 10 and 11 are in OFF (before turning on relays 10 and 11 after activating the vehicle). In the process of dispersion detection under no-load condition, for example, the voltage of each cell is compared with the average value among all the cells so as to detect the dispersed cells each of which has a voltage value greater than this average value by a degree greater than or equal to the predetermined value. Namely, the dispersed cells are detected or found by comparing the voltage between both ends of each cell with the average value among voltages of all the cells. As the method of this dispersion detection at the time of no-load, the other method which is conventionally used can be also employed.

If the answer of step S7 is NO; the variation of total voltage is smaller than the predetermined value, and hence the controller determines that the condition of battery pack 1 has not varied so much. Hence, the controller does not carry out the process of dispersion detection, and the program proceeds to step S9 directly from step S7. At step S9, the controller carries out a normal process. Namely at step S9, the controller allows motor 13 to become capable of operating, by sending the relay-ON signal to relay control section 15 and thereby turning on relays 10 and 11. Then, the controller causes motor control section 9 to control inverter 12 so that motor 13 is driven by inverter 12.

When reading out the previously-stored total voltage value at step S6, the controller surely carries out the process of dispersion detection irrespective of the value of current total voltage in the case where the previous total voltage value does not exist, for example, because dispersion detecting section 8 has been replaced with new one or because a factory-default of factory shipment has been set to a new vehicle. Thus, in the case where the data of previous total voltage is not being held (was not stored), the process of dispersion detection is certainly carried out. Accordingly, an overcharge or over discharge of each cell 2 constituting battery pack 1 can be avoided.

Moreover, a step for the process of dispersion adjustment may be provided between step S8 and step S9. The process of dispersion adjustment is conducted by turning on semiconductor switches 5 and by discharging cells 2 having relatively high capacities (voltages) by means of corresponding resistors 4, as described above. Namely, the dispersion adjustment process is conducted by adjusting or bringing the capacity of each cell 2 close to a capacity value of cell 2 having relatively small (or smallest) capacity. As an alternative, for example, the dispersion adjustment process may be conducted so as to adjust the capacities of all cells to its average capacity, by calculating the average value (average capacity) among all the cells, and by discharging cells 2 whose capacities are higher than the average value and charging cells 2 whose capacities are lower than the average value.

Now, advantages and effects according to the processing in FIGS. 2 and 3 are explained. In the process contents in FIGS. 2 and 3; the previous total voltage measured at the time of last-time deactivation of vehicle is stored in the storing section (nonvolatile memory such as EEPROM), and only the total voltage is measure at the time of current activation of vehicle. Then, if it is determined that the difference between the value of previous total voltage and the value of current total voltage is greater than or equal to a predetermined value by comparing the previous total voltage value with the current total voltage value, the dispersion detection process for the remaining capacities of respective cells is carried out. Since the total voltage is a total sum of voltages of respective cells, in the case where the current total voltage is apart from the previously-stored total voltage value by a value greater than or equal to the predetermined value, the voltage of each cell also has greatly varied from its initial state. In this case, it can be assumed that there is a high possibility that the (certain level of) dispersion in remaining capacities has occurred. Hence in such case, the dispersion detection process of remaining capacity is performed. The detection of total voltage can be conducted by a single (onetime) read-in, and hence can be conducted in a very short time as compared with the detection (read-in) of voltage data of many cells.

In other words, only the total voltage value is memorized at the time of deactivation and is compared with the total voltage value detected at the time of activation so that the degree of variation of battery pack is judged. Since the detection and read-in of total voltage can be processed at one time, this detection and read-in of total voltage take a very short amount of time as compared with the execution of dispersion detection process for the remaining capacities of entire cells. Accordingly, there is substantially no possibility that the driver is frustrated even if the detection of total voltage is carried out every time the vehicle (battery pack) is activated. Only when it is determined that the time variation of total voltage is greater than the predetermined value on the basis of the above-mentioned process, namely that the state of battery pack has largely varied; the process for detecting the dispersion in remaining capacities of entire cells is carried out. Therefore, the dispersion detection process for the remaining capacities can be reliably performed in the case where the state of battery pack has been largely varied. Moreover, by carrying out the dispersion adjustment process of the remaining capacities in accordance with the result of this detection process, the dispersion of remaining capacity caused due to long-term nonuse can be adjusted so that the overcharge or over discharge can be prevented.

Figure 4:
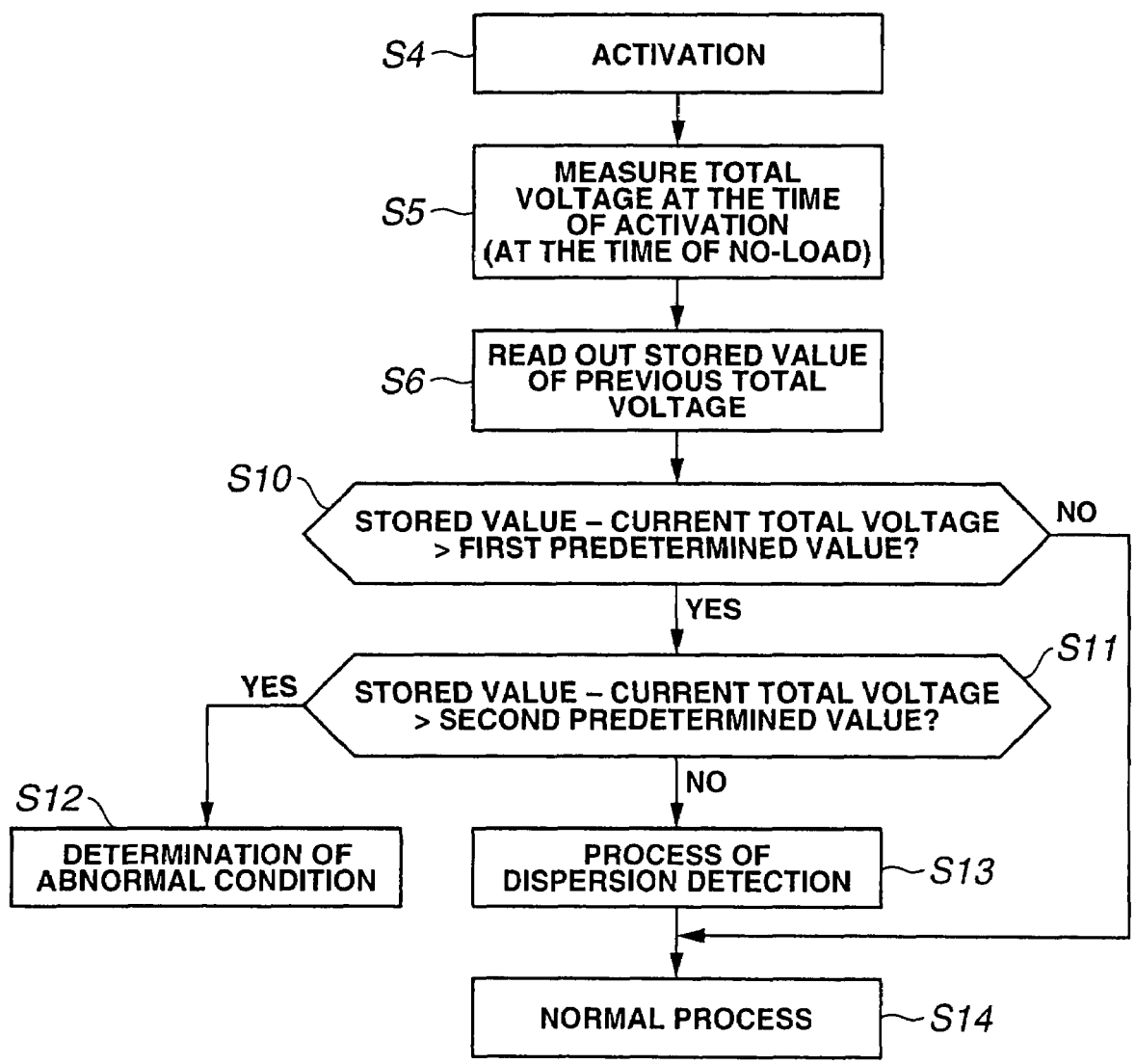
FIG. 4 is a flowchart showing another example of process contents which are executed in dispersion detecting section 8 when dispersion detecting section 8 is activated.

FIG. 4 is a flowchart showing another process contents when the vehicle or dispersion detecting section 8 is activated (becomes in operating state). Steps S4 to S6 of FIG. 4 are same as those of FIG. 3. Next at step S10, the controller compares the first predetermined value with the difference between the previously-stored value and the currently-measured value. This first predetermined value is identical with the first predetermined value of step S7 in FIG. 3. If the answer of step S10 is NO; the program proceeds directly to step S14, and the normal process is carried out in the same manner as FIG. 3.

If the answer of step S10 is YES; the controller compares a second predetermined value with the difference between the previously-stored value and the currently-measured value, at step S11. This second predetermined value is greater than the first predetermined value. If the difference between the previously-stored value and the currently-measured value is greater than the second predetermined value, namely if the current (this-time) total voltage is much lower than the previous (last-time) total voltage; the controller determines that battery pack 1 has a problem or failure. Namely, when the reduction of total voltage from the value of previous total voltage is remarkably large, it can be determined that the trouble (such as a trouble of an internal short-circuit in any of cells) has occurred in battery pack 1. Therefore, if the answer of step S11 is YES; the program proceeds to step S12, and the controller determines that some trouble has occurred in battery pack 1. In this case, for example, the driver is urged to replace battery pack 1 by seeing the lighting of a lamp indicative of the occurrence of this trouble, or for example, the process of halting the discharge from battery pack 1 is carried out.

If the answer of step S11 is NO, namely if the difference between the previously-stored value and the currently-measured value is greater than the first predetermined value and is smaller than the second predetermined value; the controller carries out the dispersion detection process at step S13, and then the program proceeds to the normal process of step S14. Note that a step for the process of dispersion adjustment may be provided between step S13 and step S14, similarly as explained in FIG. 3.

This application is based on a prior Japanese Patent Application No. 2006-186233 filed on Jul. 6, 2006. The entire contents of this Japanese Patent Application are hereby incorporated by reference.

Although the invention has been described above with reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. A remaining-capacity dispersion detecting apparatus for a battery pack, the battery pack including a plurality of cells capable of being charged and discharged, the remaining-capacity dispersion detecting apparatus comprising:
    a total voltage sensing section adapted to sense a total voltage, wherein the total voltage is a total sum of terminal voltages of the plurality of cells;
    a storing section adapted to store a value of the total voltage sensed by the total voltage sensing section when the battery pack is under a no-load condition following an on-load condition; and
    a dispersion detecting section adapted
        to detect a value of the total voltage sensed by the total voltage sensing section at a time of activation of the apparatus before the battery pack is under an on-load condition from a no-load condition,
        to compare a currently-detected total voltage value with a total voltage value previously stored by the storing section, and
        to detect a dispersion in respective remaining capacities of the plurality of cells in the case where a difference between the currently-detected total voltage value and the previously-stored total voltage value is greater than or equal to a first predetermined value.

2. The remaining-capacity dispersion detecting apparatus as claimed in claim 1, wherein
    the dispersion detecting section is adapted to detect the dispersion in respective remaining capacities of the plurality of cells irrespective of the currently-detected total voltage value in the case where the total voltage value previously stored by the storing section is absent at the time of activation.

3. The remaining-capacity dispersion detecting apparatus as claimed in claim 1, wherein
    the dispersion detecting section is adapted to determine that the battery pack has a trouble in the case where the difference between the currently-detected total voltage value and the previously-stored total voltage value is greater than or equal to a second predetermined value which is greater than the first predetermined value.

4. The remaining-capacity dispersion detecting apparatus as claimed in claim 1, wherein
    the total voltage sensing section is a total voltage sensor that directly measures the terminal voltages of the plurality of cells, or is adapted to sense the total voltage from a measured value of a voltage sensor provided in a load that is driven by electric power supplied from the battery pack.

5. The remaining-capacity dispersion detecting apparatus as claimed in claim 1, wherein
    the storing section includes a nonvolatile memory.

6. The remaining-capacity dispersion detecting apparatus as claimed in claim 4, wherein
    the battery pack and the load are equipped in a vehicle; and
    the time of activation is a time point when a key switch of the vehicle is turned on, or is a time point when a door of the vehicle is opened.

7. A remaining-capacity control apparatus for a battery pack, the battery pack including a plurality of cells capable of being charged and discharged, the remaining-capacity control apparatus comprising:
    a total voltage sensing section adapted to sense a total voltage, wherein the total voltage is a total sum of terminal voltages of the plurality of cells;
    a storing section adapted to store a value of the total voltage sensed by the total voltage sensing section when the battery pack is under a no-load condition following an on-load condition;
    a dispersion detecting section adapted
        to detect a value of the total voltage sensed by the total voltage sensing section at a time of activation of the apparatus before the battery pack is under an on-load condition from a no-load condition,
        to compare a currently-detected total voltage value with a total voltage value previously stored by the storing section, and
        to detect a dispersion in respective remaining capacities of the plurality of cells in the case where a difference between the currently-detected total voltage value and the previously-stored total voltage value is greater than or equal to a first predetermined value; and
    a remaining-capacity adjusting section adapted to adjust the respective remaining capacities of the plurality of cells so as to equalize the respective remaining capacities on the basis of the dispersion.

8. A remaining-capacity dispersion detecting apparatus for a battery pack, the battery pack including a plurality of cells capable of being charged and discharged, the remaining-capacity dispersion detecting apparatus comprising:
    first means for sensing a total voltage, wherein the total voltage is a total sum of terminal voltages of the plurality of cells;
    second means for storing a value of the total voltage sensed by the first means when the battery pack is under a no-load condition following an on-load condition;
    third means for
        receiving a value of the total voltage from the first means sensed by the first means at a time of vehicle activation before the battery pack is under an on-load condition from a no-load condition, and
        comparing a currently-received total voltage value with a previously-stored total voltage value; and
    fourth means for sensing respective remaining capacities of the plurality of cells in the case where a difference between the currently-received total voltage value and the previously-stored total voltage value is greater than or equal to a predetermined value, the third means detecting a dispersion in the respective remaining capacities in the case where the difference is greater than or equal to the predetermined value.

9. A remaining-capacity dispersion detecting method for a battery pack, the battery pack including a plurality of cells capable of being charged and discharged, the remaining-capacity dispersion detecting method comprising:
    sensing and storing a first total voltage value wherein the first total voltage value is a total sum of terminal voltages of the plurality of cells when the battery pack is under a no-load condition from an on-load condition;

sensing a second total voltage value wherein the second total voltage value is a total sum of terminal voltages of the plurality of cells at a time of vehicle activation before the battery pack is under an on-load condition from a no-load condition;

comparing the second total voltage value with the first total voltage value; and sensing respective remaining capacities of the plurality of cells and detecting a dispersion in the sensed respective remaining capacities, in the case where a difference between the second total voltage value and the first total voltage value is greater than or equal to a predetermined value.

* * * * *